(12) United States Patent  
Park et al.

(10) Patent No.: US 8,706,051 B2  
(45) Date of Patent: Apr. 22, 2014

(54) DEVICE AND METHOD FOR ADJUSTING LOOP FILTER GAIN IN AUTOMATIC FREQUENCY CONTROLLER

(75) Inventors: Soo-Jin Park, Suwon-si (KR); Chae-Man Lim, Seoul (KR)

(73) Assignee: Samsung Electronics Co., Ltd (KR)

( * ) Notice: Subject to any disclaimer, the term of this patent is extended or adjusted under 35 U.S.C. 154(b) by 2094 days.

(21) Appl. No.: 11/700,403

(22) Filed: Jan. 31, 2007

(65) Prior Publication Data

US 2007/0200639 A1    Aug. 30, 2007

(30) Foreign Application Priority Data

Feb. 1, 2006   (KR) .................. 10-2006-0009713

(51) Int. Cl.  
*H04B 1/40*    (2006.01)

(52) U.S. Cl.  
USPC ............ 455/75; 455/120; 455/123; 331/16

(58) Field of Classification Search  
USPC ................. 455/75, 120, 123; 331/16  
See application file for complete search history.

(56) References Cited

U.S. PATENT DOCUMENTS

| | | | |
|---|---|---|---|
| 3,740,671 A | | 6/1973 | Crow et al. |
| 5,909,148 A | * | 6/1999 | Tanaka .............................. 331/2 |
| 6,016,080 A | | 1/2000 | Zuta et al. |
| 2003/0232606 A1 | * | 12/2003 | Akahori ......................... 455/123 |
| 2004/0248533 A1 | | 12/2004 | Mannermaa | 
| 2005/0101278 A1 | * | 5/2005 | Peng .......................... 455/250.1 |

FOREIGN PATENT DOCUMENTS

| | | |
|---|---|---|
| EP | 0 660 526 | 12/1994 |
| KR | 1020000033949 | 6/2000 |
| KR | 10-2005-0038038 | 4/2005 |

* cited by examiner

*Primary Examiner* — Edward Urban  
*Assistant Examiner* — Hsin-Chun Liao  
(74) *Attorney, Agent, or Firm* — The Farrell Law Firm, P.C.

(57) ABSTRACT

Provided is a device and a method for adjusting a loop filter gain in an automatic frequency controller, which can allow the automatic frequency controller to operate while maintaining an optimal performance. The device includes a velocity estimator for estimating a change in velocity in accordance with a movement of a terminal; a loop filter gain controller for controlling a loop filter gain in accordance with a change in velocity received from the velocity estimator; and a loop filter gain unit for multiplying a loop filter gain received from the loop filter gain controller and a frequency error for output. Further, there is provided a method for adjusting a loop filter gain in an automatic frequency controller, having the steps of: estimating a change in velocity in accordance with a movement of a terminal; adjusting a loop filter gain in accordance with the estimated change in velocity; and multiplying the adjusted loop filter value and a frequency error for output.

6 Claims, 2 Drawing Sheets

DEVICE AND METHOD FOR ADJUSTING LOOP FILTER GAIN IN AUTOMATIC FREQUENCY CONTROLLER

PRIORITY

This application claims the benefit under 35 U.S.C. §119 (a) of an application entitled "Device And Method For Adjusting Loop Filter Gain In Automatic Frequency Controller" filed in the Korean Industrial Property Office on Feb. 1, 2006 and assigned Serial No. 2006-9713, the contents of which are incorporated herein by reference.

BACKGROUND OF THE INVENTION

1. Field of the Invention

The present invention relates generally to a device and a method for adjusting a loop filter gain in an automatic frequency controller, and in particular, to a device and a method for adjusting a loop filter gain in an automatic frequency controller, which can allow the automatic frequency controller to operate while maintaining optimal performance.

2. Description of the Related Art

Since a carrier frequency depending on temperature gradually changes, a frequency offset is an unavoidable primary factor to cause a deterioration of performance in a radio communication system. If there exists a frequency offset between a carrier frequency and a local oscillation frequency of a receiver, a power spectrum density of a channel observed from the receiver can be expressed by the following formula.

$$S(f) = \frac{b_0}{\pi \cdot f_d \sqrt{1 - \frac{(f - f_{offset})^2}{f_d}}}$$

Wherein $b_o$ is a contant, $f_d$=Doppler frequency, and $f_{offset}$=frequency offset.

This means that a change of a channel including a frequency offset is determined by means of an offset interval ($f_{offset}+f_d$). If other fading compensation techniques can also compensate a change in phase due to the frequency offset, an Automatic Frequency Controller (AFC) is omitted so that simplification of a receiver can be achieved. However, in most cases, the AFC for minimizing the frequency offset is required.

A Common Pilot Channel (CPICH) of a first antenna and a diversity CPICH of a second antenna become reference signals of a frequency control loop in a Wideband Code Division Multiple Access (WCDMA) system. At a reception terminal, frequency error components are shown in signals of the two CPICHs. A phase of the CPICH can be calculated as a mean phase by adopting an arbitrary time interval (Td) regardless of the transmission rate of a traffic channel. Integrating and dumping the reception signal at an interval (t−Td/2, t+Td/2) can provide for the phase of a reception signal. Since a pilot channel transmits an unmodulated signal, the AFC can calculate a change in phase by taking a cross product of a continuous pilot signal. The aforementioned result becomes a linear estimation value of the change in phase with respect to a small phase change, and the change in phase is precisely in proportion to a frequency error.

The change in phase is generated because a terminal has a relative timing inaccuracy with respect to a base station. A timing reference of the terminal is a Temperature Crystal Oscillator (TCXO), and the timing inaccuracy is generated due to a small frequency error of the TCXO. Thus, a frequency of the TCXO is adjusted to set timing between the terminal and the base station.

A change in phase of the CPICH is accumulated in the AFC, and the AFC determines whether its sign is much faster than the frequency of the TCXO so as to compensate for a frequency error.

The AFC is configured within a modem provided in a terminal. The AFC has a frequency error detector detecting a frequency error, a loop filter infinitely accumulating the detected error and a Pulse Density Modulation (PDM) unit. The PDM unit functions as a Digital Analog Converter (DAC) for converting an output of the loop filter into an analog voltage to control an output frequency of a VCTCXO (Voltage Controlled Temperature Crystal Oscillator).

An operation of the AFC is divided into an acquisition step and a tracking step. In the acquisition step, since a frequency should be within a certain frequency error range in a rapid time, the bandwidth of a frequency control loop becomes broad. On the other hand, to reduce an influence cause by a noise in the tracking step, the bandwidth of a frequency control loop becomes narrow to reduce residual frequency error.

Each of the acquisition and tracking steps has a predetermined loop filter gain K to adjust a bandwidth. After a certain time, the acquisition step moves to the tracking step, and the tracking step has a predetermined small loop filter gain K to use a narrow bandwidth. There is a high possibility that a user equipment (UE) which accelerates in a short time period, such as on a rapid transit railway will lose a lock state due to the bandwidth of a small loop in the tracking step. Further, a Quadrature Amplitude Modulation (QAM) method is used in a High Speed Downlink Packet Access (HSDPA) for a high speed packet data service in the future, and the QAM modulation method is more sensitive for a frequency error. Therefore, there is a disadvantage in that the conventional AFC having a fixed loop bandwidth through a fixed loop gain is not flexible for various circumstances.

SUMMARY OF THE INVENTION

Accordingly, the present invention has been made to solve the above-mentioned problems occurring in the conventional art, and it is an object of the present invention to provide a device and a method for adjusting a loop filter gain in an automatic frequency controller, which can allow the automatic frequency controller to operate while maintaining optimal performance.

It is another object of the present invention to provide a device and a method for adjusting a loop filter gain in an automatic frequency controller, which can variably shift a loop bandwidth in accordance with a change in velocity.

In order to accomplish these objects of the present invention, according to the present invention, there is provided a device for adjusting a loop filter gain in an automatic frequency controller, which includes a velocity estimator for estimating a change in velocity in accordance with a movement of a terminal; a loop filter gain controller for controlling a loop filter gain in accordance with a change in velocity received from the velocity estimator; and a loop filter gain unit for multiplying a loop filter gain received from the loop filter gain controller and a frequency error, for output.

In order to accomplish these objects of the present invention, according to another aspect of the present invention, there is provided a method for adjusting a loop filter gain in an automatic frequency controller, which includes estimating a change in velocity in accordance with a movement of a terminal; adjusting a loop filter gain in accordance with the estimated change in velocity; and multiplying the adjusted loop filter value and a frequency error for output.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Figure 1:
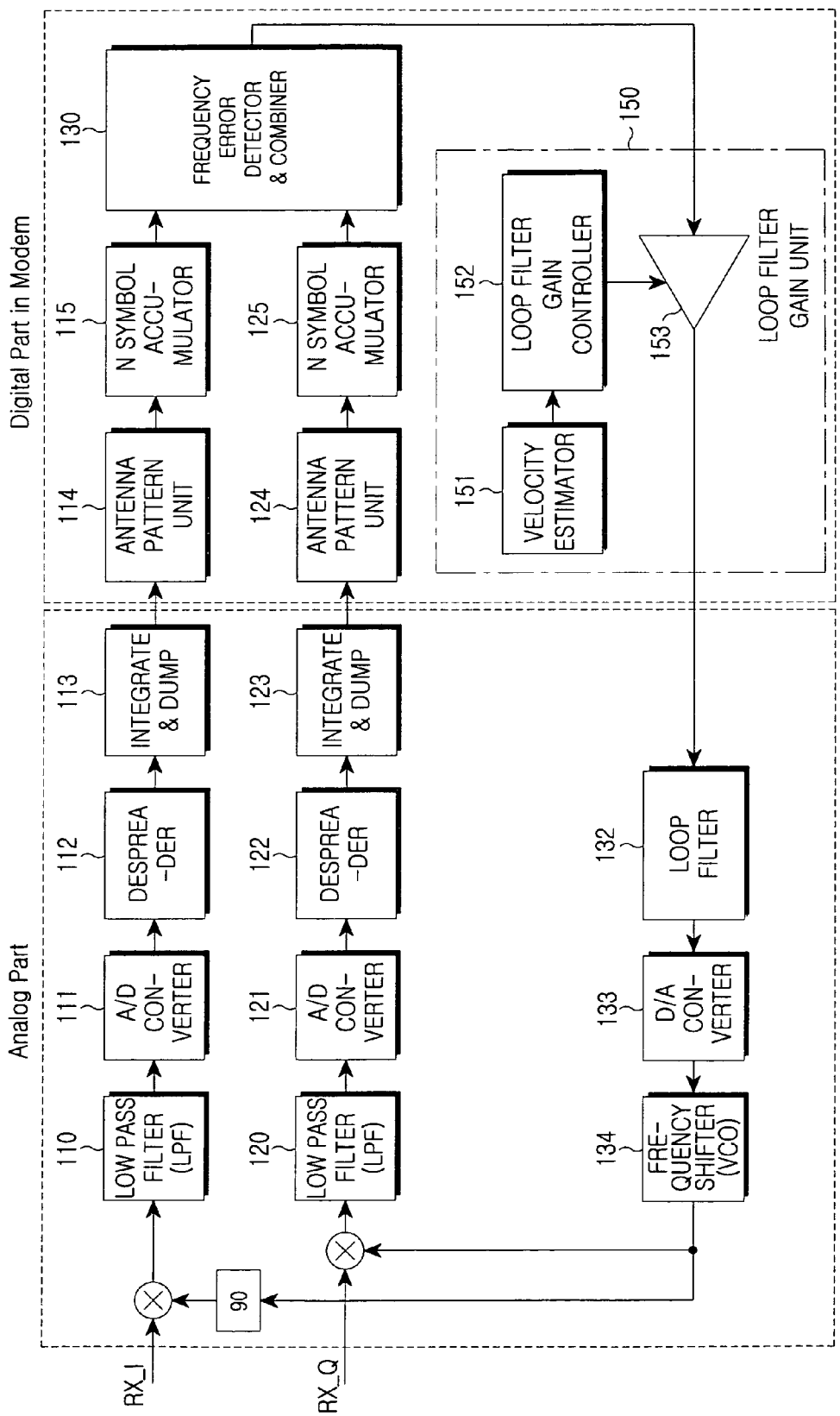
FIG. 1 is a block diagram showing a configuration of an automatic frequency controller having a loop filter gain adjusting unit included therein according to the present invention.

Hereinafter, preferred embodiments of the present invention will be described with reference to the accompanying drawings. In the following description, the same elements will be designated by the same reference numerals although they are shown in different drawings. Further, various specific definitions found in the following description, such as specific values of packet identifications, contents of displayed information, etc., are provided for a general understanding of the present invention, and it is apparent to those skilled in the art that the present invention can be implemented without such definitions. Further, in the following description of the present invention, a detailed description of known functions and configurations incorporated herein will be omitted when it may make the subject matter of the present invention rather unclear.

Figure 2:
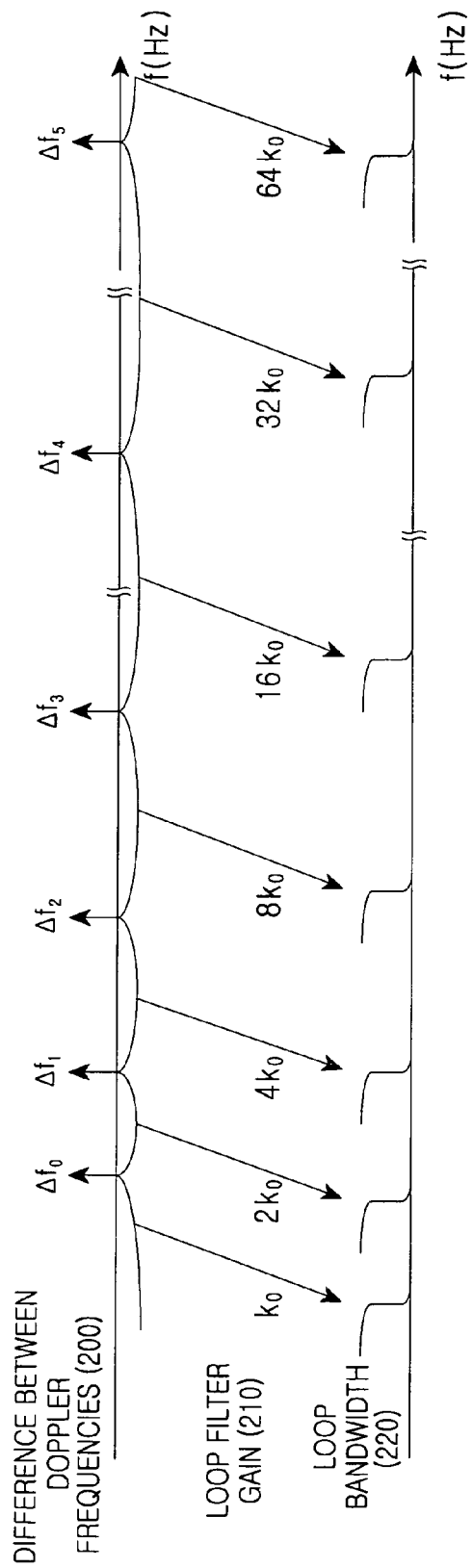
FIG. 2 is a view illustrating a loop bandwidth shifted in accordance with a change in velocity through the loop filter gain adjusting unit according to the present invention.

FIG. 1 is a block diagram showing a configuration of an automatic frequency controller having a loop filter gain adjusting unit included therein according to the present invention. FIG. 2 is a view illustrating a loop bandwidth shifted in accordance with a change in velocity through the loop filter gain adjusting unit according to the present invention.

A structure of the automatic frequency controller will be discussed with reference to FIG. 1. Referring to FIG. 1, a low pass filter (LPF) 110 receives and filters an I signal of two signals respectively received from first and second antennas, i.e., I and Q signals. The low pass filter 110, then outputs the filtered I signal to an Analog/Digital (A/D) converter 111.

The A/D converter 111 converts the analog I signal from the LPF 110, into a digital signal, then outputs the converted I signal to a despreader 112.

The despreader 112 restores the received digital I signal, from the A/D converter 111 into a despread signal and outputs the restored despread I signal to an integrate/dump unit 113.

The integrate/dump unit 113 creates the I signal received from the despreader 112 as a bit and outputs the I signal created as a bit to an antenna pattern unit 114.

The antenna pattern unit 114 multiplies the I signal received from the integrate/dump, unit 113 created as a bit by a correspondent antenna pattern to extract information on a correspondent bit. That is, since the received antenna signals (I and Q signals) respectively received from the first and second antennas are mixed, the antenna pattern unit 114 multiplies the I signal by the correspondent antenna pattern to extract the I signal so that information on the correspondent bit, i.e., bit information on the I signal is extracted. The antenna pattern unit 114 outputs the bit information on the extracted I signal to an n symbol accumulator 115.

The n symbol accumulator 115 increases the bit information on the I signal output from the antenna pattern unit 114 to extract further information. The n symbol accumulator 115 outputs a value of the increased I signal to a frequency error detector/combiner 130.

Further, referring to FIG. 1, a low pass filter (LPF) 120, an A/D converter 121, a despreader 122, an integrate/dump unit 123, an antenna pattern unit 124 and an n symbol accumulator 125 are components processing the Q signal of the two I and Q signals respectively received from the first and second antennas, and perform operations identical with the LPF 110, the A/D converter 111, the despreader 112, the integrate/dump unit 113, the antenna pattern unit 114 and the n symbol accumulator 115.

The frequency error detector/combiner 130 multiplies and adds the I and Q signals respectively received from the n symbol accumulators 115 and 125 to extract a frequency error, and outputs the extracted frequency error to a loop filter gain adjusting unit 150.

In order to variably change a loop bandwidth, the loop filter gain adjusting unit 150 according to the present invention performs an operation of adjusting a loop gain depending on a moving velocity of a terminal. The loop filter gain adjusting unit 150 includes a velocity estimator 151, a loop filter gain controller 152 and a loop filter gain unit 153.

A configuration of the loop filter gain adjusting unit 150 will be discussed herein. The velocity estimator 151 estimates a change in velocity in accordance with a movement of a terminal having the AFC included therein. The velocity estimator 151 extracts a Doppler frequency generated depending on the estimated change in velocity and outputs the extracted Doppler frequency to the loop filter gain controller 152.

The loop filter gain controller 152 functions to adjust a loop filter gain depending on a value of the received change in velocity transmitted by the velocity estimator 151. The loop filter gain controller 152 receives a Doppler frequency generated from the velocity estimator 151 in accordance with the change in velocity, extracts a difference between the received Doppler frequencies, and adjusts a loop filter gain in accordance with the extracted difference between Doppler frequencies. The loop filter gain controller 152 outputs the loop filter gain set to adjust depending on a change in velocity of the terminal to the loop filter gain unit 153.

The loop filter gain unit 153 multiplies a received loop filter gain transmitted by the loop filter gain controller 152 and a frequency error received from the frequency error detector/combiner 130, and then outputs them to a loop filter 132.

FIG. 2 is a view illustrating a loop bandwidth variably shifted in accordance with a change in velocity through the loop filter gain adjusting unit 150 according the present invention, in which Doppler frequencies are received from the velocity estimator 151 and the difference 200 between the Doppler frequencies is obtained through the evaluation of the loop filter gain controller 152.

A loop filter gain 210 represents a loop filter gain set to adjust in accordance with the difference between Doppler frequencies 200.

A loop bandwidth 220 represents a loop bandwidth generated when multiplying a loop filter gain received to variably adjust in accordance with a change in velocity from the loop filter gain controller 152 to the loop filter gain unit 153 and a frequency error received from the frequency error detector/combiner 130 and then for output.

The loop bandwidth is variably changed in accordance with a change in velocity through the loop filter gain adjusting unit 150 configured in such a manner so that the automatic frequency controller is more flexible for a temperature as well as various circumstances in accordance with the change in velocity.

The loop filter 132 is configured as an infinite accumulator. The loop filter 132 accumulates a received frequency error transmitted from the loop filter gain unit 153 of the loop filter gain adjusting unit 150 and extracts a superior value of the accumulated frequency errors to output it to a D/A converter 133.

The D/A converter 133 converts the received frequency error of a digital signal transmitted from the loop filter unit 132 into an analog signal and outputs the frequency error converted into the analog signal to a frequency shifter 134.

The frequency shifter 134 compensates the frequency error of a received signal. The frequency shifter 134 shifts the received frequency error of the analog signal transmitted from the D/A converter 133 into a voltage and compensates for an error between frequencies of a base station and a terminal to make the frequencies identical with each other.

As described above, the present invention has an advantage in that an entire loop bandwidth of an automatic frequency controller is variably shifted depending on an amount of a change in velocity so that the automatic frequency controller can maintain a lock state and operate with optimal performance.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A device for adjusting a loop filter gain in an automatic frequency controller, comprising:

a velocity estimator for estimating a change in velocity in accordance with a movement of a terminal;

a loop filter gain controller for controlling a loop filter gain in accordance with a received change in velocity transmitted by the velocity estimator; and a loop filter gain unit for multiplying a received loop filter gain transmitted by the loop filter gain controller and a frequency error for output.

2. The device as claimed in claim 1, wherein the velocity estimator extracts a Doppler frequency generated in accordance with the estimated change in velocity.

3. The device as claimed in claim 1, wherein the loop filter gain controller receives a Doppler frequency generated from the velocity estimator in accordance with a change in velocity, extracts a difference between received Doppler frequencies, and adjusts a loop filter gain in accordance with the extracted difference between Doppler frequencies.

4. The device as claimed in claim 1, wherein the loop filter gain unit receives a frequency error from a frequency error detector/combiner of the automatic frequency controller.

5. A method for adjusting a loop filter gain in an automatic frequency controller, comprising the steps of:

estimating a change in velocity in accordance with a movement of a terminal;

adjusting a loop filter gain in accordance with the estimated change in velocity; and multiplying the adjusted loop filter value and a frequency error for output.

6. The method as claimed in claim 5, wherein the step of adjusting the loop filter gain comprises:

extracting a difference between Doppler frequencies generated in accordance with the estimated change in velocity; and adjusting a loop filter gain in accordance with the extracted difference between Doppler frequencies.

* * * * *